United States Patent [19]
Tasdighi

[11] Patent Number: 5,814,995
[45] Date of Patent: Sep. 29, 1998

[54] VOLTAGE DETECTOR FOR BATTERY OPERATED DEVICE

[75] Inventor: Ali Tasdighi, San Jose, Calif.

[73] Assignee: TelCom Semiconductor, Inc., Mountain View, Calif.

[21] Appl. No.: 713,575

[22] Filed: Sep. 12, 1996

[51] Int. Cl.$^6$ .................... G01R 31/36; G01N 27/416
[52] U.S. Cl. ............................. 324/431; 324/433
[58] Field of Search .................................. 324/426, 431, 324/433; 340/636; 320/48

[56] References Cited

U.S. PATENT DOCUMENTS 5,140,269  8/1992  Champlin ............................. 324/433
5,426,371  6/1995  Salley et al. ......................... 324/429

Primary Examiner—Glenn W. Brown
Attorney, Agent, or Firm—Skjerven, Morrill, MacPherson, Franklin & Friel; Brian D. Ogonowsky

[57] ABSTRACT

A voltage detector is described herein which eliminates an entire operational amplifier or comparator from conventional voltage detectors. In one embodiment of such a voltage detector, a band gap reference generator is connected so as not to incorporate any feedback mechanism and where an off balance in the band gap reference generator is used to detect whether an input voltage falls below a threshold voltage. By eliminating the feedback path in the band gap reference generator, a comparator is eliminated. Other types of voltage detectors which provide a highly stable operation over a wide range of temperatures are described.

11 Claims, 4 Drawing Sheets

VOLTAGE DETECTOR FOR BATTERY OPERATED DEVICE

FIELD OF THE INVENTION

This invention relates to voltage detectors for monitoring whether the battery voltage in a device is below a predetermined threshold.

BACKGROUND OF THE INVENTION

In many battery operated devices, voltage detectors are used to monitor the battery output voltage and identify to a control circuit, such as a microprocessor, when the battery output voltage falls below a certain voltage. In response, the control circuit may issue a warning signal to the operator and/or prevent further operation of the device in order to avoid any malfunction. Primary attributes of such a voltage detector are low cost, small size, accurate detection of voltage over the entire supply voltage range and temperature range, and low power consumption.

A simple configuration of such a voltage detector 10 is shown in FIG. 1. A battery operated device 12, such as a laptop computer; a wireless telephone, or any other device, is powered by a battery 14. Battery 14 powers both the primary load 16 and the voltage detector 10. If voltage detector 10 detects that the battery voltage is below a predetermined threshold, then an output of voltage detector 10 illuminates an LED 18 or other warning device. Voltage detector 10 may also signal to a control circuit within load 16, via line 20, to take certain actions in response to the low voltage detection.

FIG. 2 illustrates a basic voltage detector 10 which receives a battery voltage at terminal 22. A voltage reference source 24 provides a highly stable reference voltage to an inverting input of comparator 26, and a divided battery voltage at the connection of resistors $R_D$ and $R_U$ is applied to the noninverting terminal of comparator 26. A current source 28 provides current for the reference source 24. The selection of resistors $R_D$ and $R_U$ sets the battery threshold voltage at which the output of comparator 26 changes from a logical high to a logical low to indicate that the battery voltage is below the threshold. In one example, the output of reference source 24 is a band gap reference of 1.2 volts. If the lowest tolerable battery voltage is 2.4 volts, then resistors $R_D$ and $R_U$ are chosen to be equal such that when the battery voltage is below 2.4 volts, the voltage at the noninverting terminal of comparator 26 will be below the reference voltage, and the output of comparator 26 will go low to indicate a low voltage condition.

FIG. 3 illustrates a prior art band gap reference source 24 which may be used in the embodiments of FIG. 1 and FIG. 2. Such a band gap reference source 24 is well known and basically combines a first voltage component having a negative temperature coefficient with a second voltage component having a positive temperature coefficient. The temperature coefficients cancel each other out. Thus, the output voltage (approximately 1.2 volts) is relatively constant over a wide temperature range. There are many different types of band gap references.

In the example of FIG. 3, the emitter area of transistor Q2 is selected to be a multiple (e.g., 10 times) the emitter area of transistor Q1. Transistors Q1 and Q2 have their bases connected together. The output of an operational amplifier (op amp) 32 is connected in a feedback loop to the bases of transistors Q1 and Q2 so as to equalize the op amp's inverting and noninverting inputs. The output of reference source 24 is the reference voltage ($V_R$)

In operation, the voltage at the emitter of transistor Q1 will be $V_R - V_{BE1}$. Since op amp 32 acts to equalize its noninverting and inverting inputs, the voltage at the junction of resistors R1 and R2 will be forced to equal $V_R - V_{BE1}$. Accordingly, $$(V_R - V_{BE2})R2/(R1+R2) = V_R - V_{BE1} \qquad (\text{eq. 1})$$

By reducing equation 1, we get, $$V_R = (V_{BE1} - V_{BE2})R2\backslash R1 + V_{BE1} \qquad (\text{eq. 2})$$

The $\Delta V_{BE}$ component (i.e., $V_{BE1} - V_{BE2}$) has a positive temperature coefficient, while the $V_{BE1}$ component has a negative temperature coefficient. $V_{BE2}$ is less than $V_{BE1}$ when identical currents flow through the two transistors, due to transistor Q2 having a larger emitter area. $V_{BE2}$ has a negative temperature coefficient which is greater than that of $V_{BE1}$. By the proper selection of the various resistor values and relative emitter areas, $V_R$ can be optimally chosen. This optimal $V_R$ for the best cancelling of temperature coefficients, so as not to drift over temperature variations, is approximately 1.2 volts.

FIG. 4 illustrates another reference source 33 which may also be used as the reference source 24 in FIG. 2. Reference source 33 uses a differential amplifier consisting of a depletion mode NMOS transistor 36, NMOS transistor 38, PMOS transistors 40 and 42 (connected as current mirrors), and current source 44. A PMOS transistor 46 receives a feedback signal from the drain of NMOS transistor 36 and has its drain coupled the gate of NMOS transistor 38. Resistors R1 and R2 are chosen to balance the differential amplifier when the output is optimally chosen to cause the positive and negative temperature coefficients in the circuit to offset one another.

The various voltage detectors described work adequately, but it is desirable to reduce their size, cost, and power consumption.

SUMMARY

A modification to prior art voltage detectors is described herein which eliminates an entire operational amplifier or comparator from the voltage detector. In one such embodiment, the op amp in prior art FIG. 3 is deleted entirely. The bases of transistors Q1 and Q2 are connected to a divided battery voltage rather than to a reference source feedback terminal. A comparator, providing the output of the voltage detector, is coupled between the terminals of R2 and R3 in FIG. 3. If the divided battery voltage is less than the reference voltage level needed to balance the circuit, the comparator will issue a control signal indicating a low battery voltage.

Similar modifications of existing voltage detectors using a variety of reference sources would be understood by those skilled in the art after reading this disclosure.

DETAILED DESCRIPTION OF THE PREFERRED EMBODIMENTS

Figure 1:
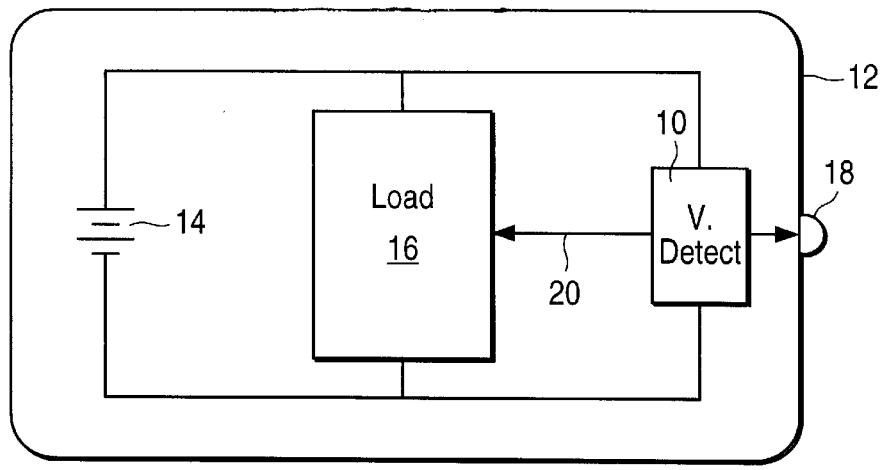
FIG. 1 illustrates a battery operated device having a voltage detector for detecting a low battery voltage.
Figure 5:
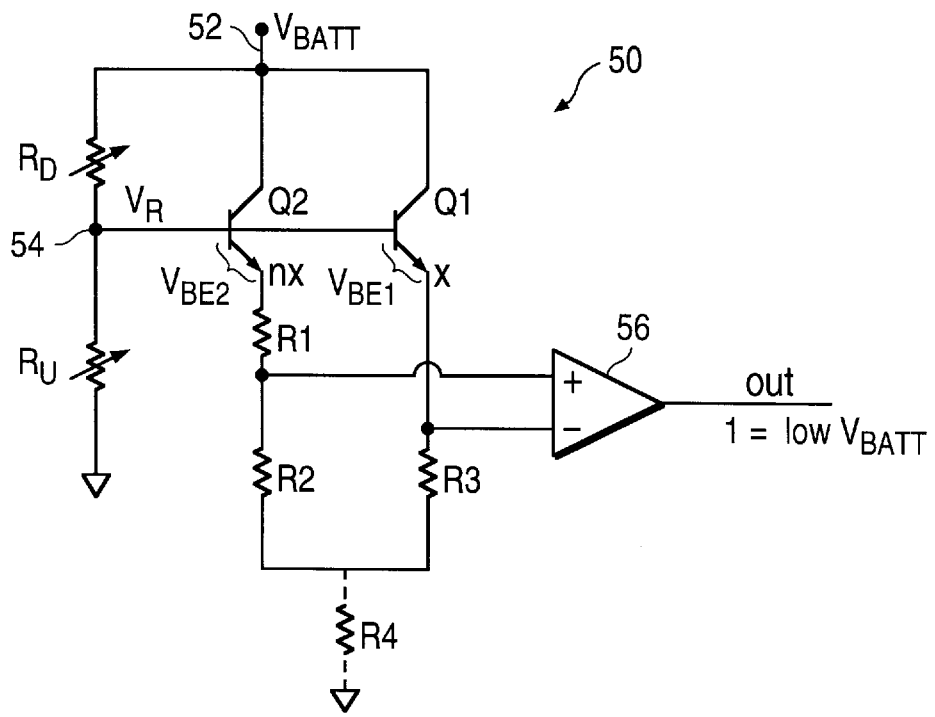
FIG. 5 is a schematic diagram of a voltage detector in accordance with the preferred embodiment of the invention which may be used as the voltage detector 10 in FIG. 1.

FIG. 5 illustrates a preferred embodiment of a voltage detector 50 incorporated in a battery operated device, such as device 12 shown in FIG. 1. Voltage detector 50 and other battery powered circuits may be formed on the same monolithic integrated circuit.

Figure 2:
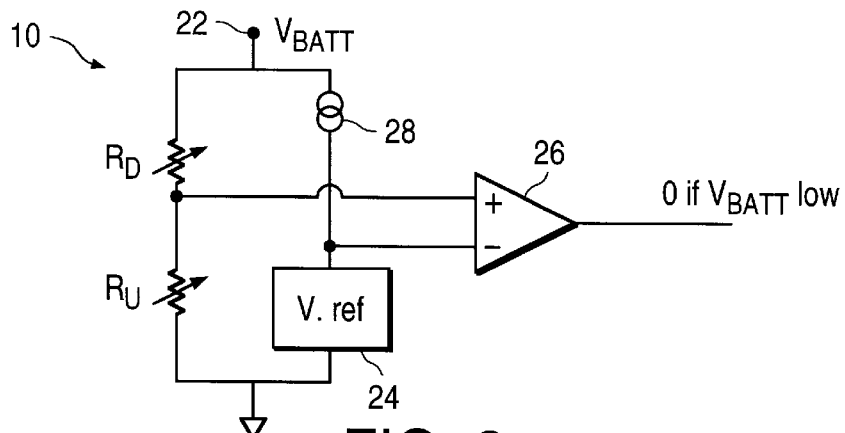
FIG. 2 illustrates a conventional voltage detector.
Figure 3:
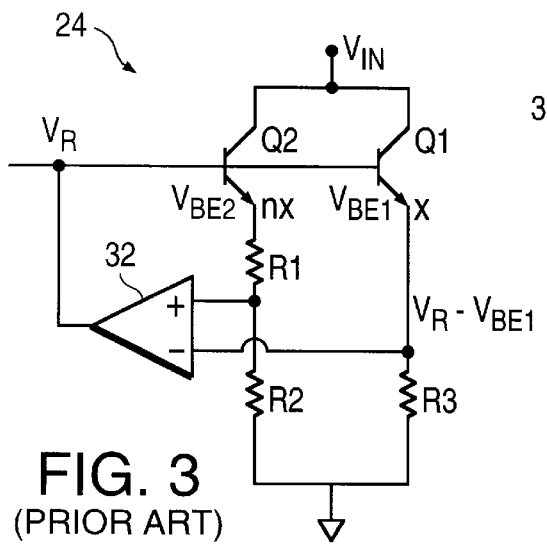
FIG. 3 illustrates a band gap reference source for use in the voltage detector of FIG. 2.

Voltage detector 50 of FIG. 5 obviates the need for the operational amplifier 32 in FIG. 3 and obviates the need for any current source, such as current source 28 in FIG. 2. This results in a smaller and lower cost voltage detector which uses less power than the prior art voltage detectors.

In the circuit of FIG. 5, the battery voltage is coupled to terminal 52. Transistors Q1 and Q2 have their collectors connected to terminal 52 and their bases coupled together and to a common node 54 of a resistor divider. The resistor divider is formed of resistors $R_D$ and $R_U$, which may be adjustable resistors or fixed resistors. Resistance adjustments may be made by mask trimming or using other known techniques.

The emitter of transistor Q1 is connected through resistor R3 to ground, or optionally to resistor R4. The emitter of transistor Q2 is connected through resistors R1 and R2 to ground, or optionally to resistor R4.

The emitter of transistor Q1 is also connected to the inverting terminal of comparator 56. The junction of resistors R1 and R2 is connected to the noninverting terminal of comparator 56. The output of comparator 56 is either a high signal or a low signal, depending upon whether the battery voltage at terminal 52 is above or below a threshold voltage, as will be described.

As described with respect to FIG. 3, a particular voltage ($V_R$) applied to the bases of transistors Q1 and Q2 will cause the voltage at the emitter of transistor Q1 (i.e., $V_R - V_{BE1}$) and the voltage at the junction of resistors R1 and R2 to be equal. For a band gap reference source, the relative emitter areas of transistors Q1 and Q2 and the resistor values should be chosen so that when $V_R$ is approximately 1.2 volts the voltages at the inputs to comparator 56 will be equal. At the band gap voltage of 1.2 volts, $V_R$ is stable over a wide range of temperatures since the positive temperature coefficient offsets the negative temperature coefficient. Other values of $V_R$ may also be chosen.

Resistors R1 and R2 can be selected to achieve the desired reference voltage $V_R$ per the formulation below:

$$V_R = V_T ln(n)[1 + R2/R1] + V_{BE1},\qquad\text{(eq. 3)}$$

where $V_T = kT/q$, $V_{BE1}$ is the base-emitter voltage of transistor Q1, and n is equal to the collector-current density of transistor Q1 divided by the collector-current density of transistor Q2. Since transistor Q2 has a larger emitter area, its collector-current density will be smaller than that of transistor Q1. For n equal to 16, the R2/R1 ratio will typically be 15 to 20, depending on the band gap voltage of the particular process technology.

In contrast to FIG. 3, where the output of op amp 32 was fed back into the bases of transistors Q1 and Q2 to balance the circuit, in the embodiment of FIG. 5, the output of comparator 56 is not fed back to the bases of transistors Q1 and Q2. The comparator 56 triggers (goes to a logical 1) when the divided battery voltage applied to the bases of transistors Q1 and Q2 goes below the band gap reference voltage of 1.2 volts. Since the output of comparator 56 is not fed back, the comparator 56 can, instead, be configured to output a logic 0 level upon detection of a low voltage, depending upon the user's needs.

The selection of resistors $R_D$ and $R_U$ is made in accordance with the following equation:

$$V_R = V_{BATT}[R_U/(R_D + R_U)]\qquad\text{(eq. 4)}$$

By adjusting the ratio of resistors $R_U$ and $R_D$, different detection voltage levels can be set. Resistors $R_U$ and $R_D$ may be trimmable or otherwise programmable or variable using any known methods.

Optional resistor R4 may be connected to resistors R2 and R3 to reduce the current consumed by the voltage detector without having to increase the physical sizes of both R2 and R3.

The equations 1 and 2 presented with respect to FIG. 3 can also be applied to the embodiment of FIG. 5 to describe the relationships between the base-emitter voltages of the transistors, the resistors, the temperature coefficients, and the reference voltage needed to balance comparator 56.

Figure 4:
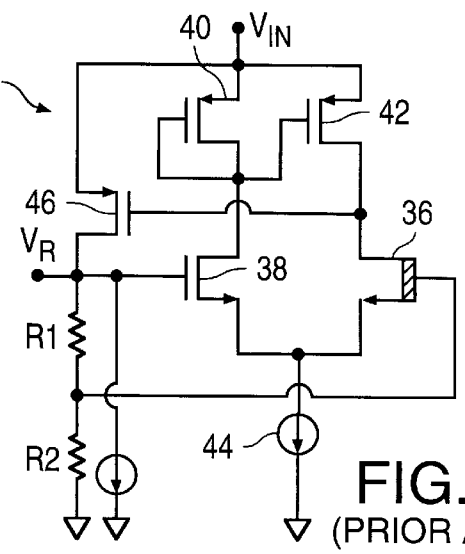
FIG. 4 illustrates a depletion mode type reference source for use in the voltage detector of FIG. 2.

Other voltage reference sources using feedback, similar to that shown in FIGS. 3 and 4, are known.

This invention is also intended to cover modifications to all these known voltage reference circuits to create a voltage detector. The modification disconnects the feedback path in the prior art circuits, and the output of the disconnected feedback path provides the output of the voltage detector. The former feedback input terminal into the prior art voltage reference source is now coupled to a node of a voltage divider. If the node drops below a threshold voltage, the output of the voltage detector is triggered to indicate that there is a low voltage situation.

Figure 6:
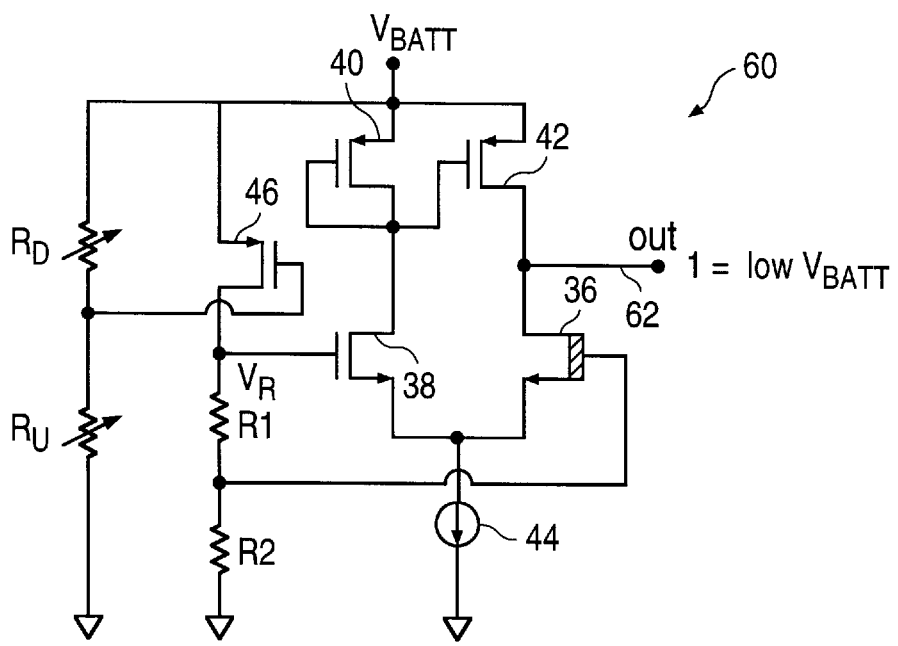
FIG. 6 is a schematic diagram of another voltage detector using the concepts of the present invention.

Such a modification to the prior art voltage reference source of FIG. 4 is shown in the voltage detector 60 of FIG. 6. Like elements are identified with like numerals in FIGS. 4 and 6 and will be not be redundantly described. The depletion mode NMOS transistor 36 has a threshold voltage with a positive temperature coefficient, while the NMOS transistor 38 has a threshold voltage with a negative temperature coefficient. These temperature coefficients offset one another to create a stable voltage source over a wide range of temperatures. Resistors R1 and R2 are selected to generate a reference voltage $V_R$ which best offsets the positive and negative temperature coefficients under the anticipated operating conditions.

As seen by a comparison of FIGS. 4 and 6, the feedback connection to the gate of PMOS transistor 46 has been disconnected in FIG. 6 and now becomes the output terminal 62 of the voltage detector 60. The input signal into PMOS transistor 38 is now related to the divided battery voltage. Hence, the divided battery voltage triggers the voltage on output terminal 62 when the divided battery voltage dips below the value necessary to balance the differential amplifier. The differential amplifier acts as a comparator.

Figure 7:
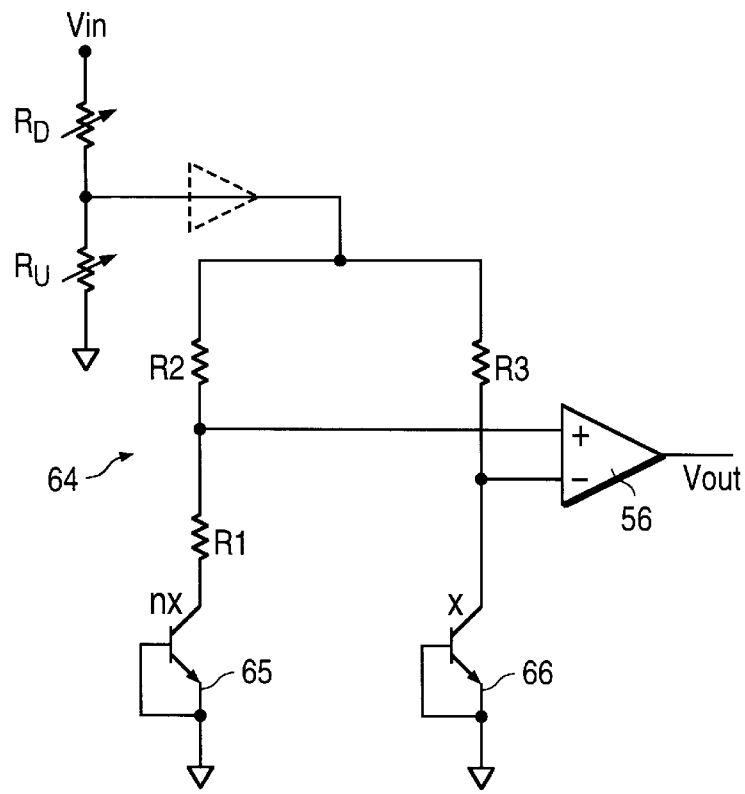
FIGS. 7 and 8 are alternative embodiments of voltage detectors incorporating the present invention.

FIG. 7 illustrates another embodiment of a voltage detector 64. Detector 64 uses PNP transistor 65 and 66 with different emitter sizes to achieve the reference voltage. The bases and collectors of transistors 65 and 66 are connected to ground. A comparison of FIGS. 7 and 5 reveals that they use similar inventive concepts. A buffer 67 may be needed for certain voltage detection requirements.

Figure 8:
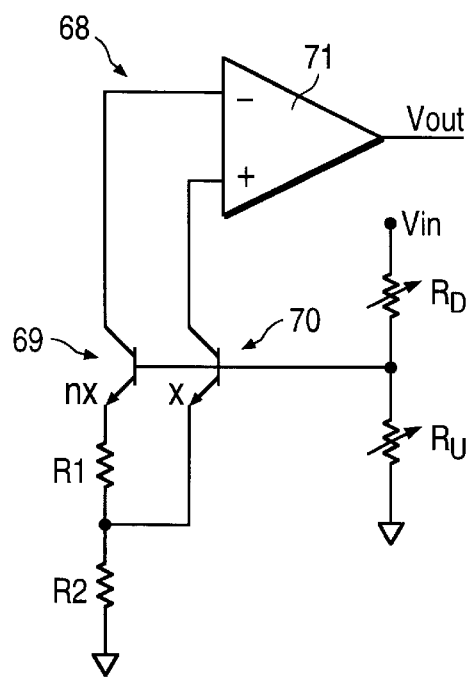

FIG. 8 illustrates a detector 68 similar to that in FIG. 5 but where the collectors of transistors 69 and 70 are connected to a current amplifier 71 acting as a comparator.

In all embodiments, the inputs into the comparator may be switched to provide either a high output or a low output upon detection of a low input voltage.

Figure 9:
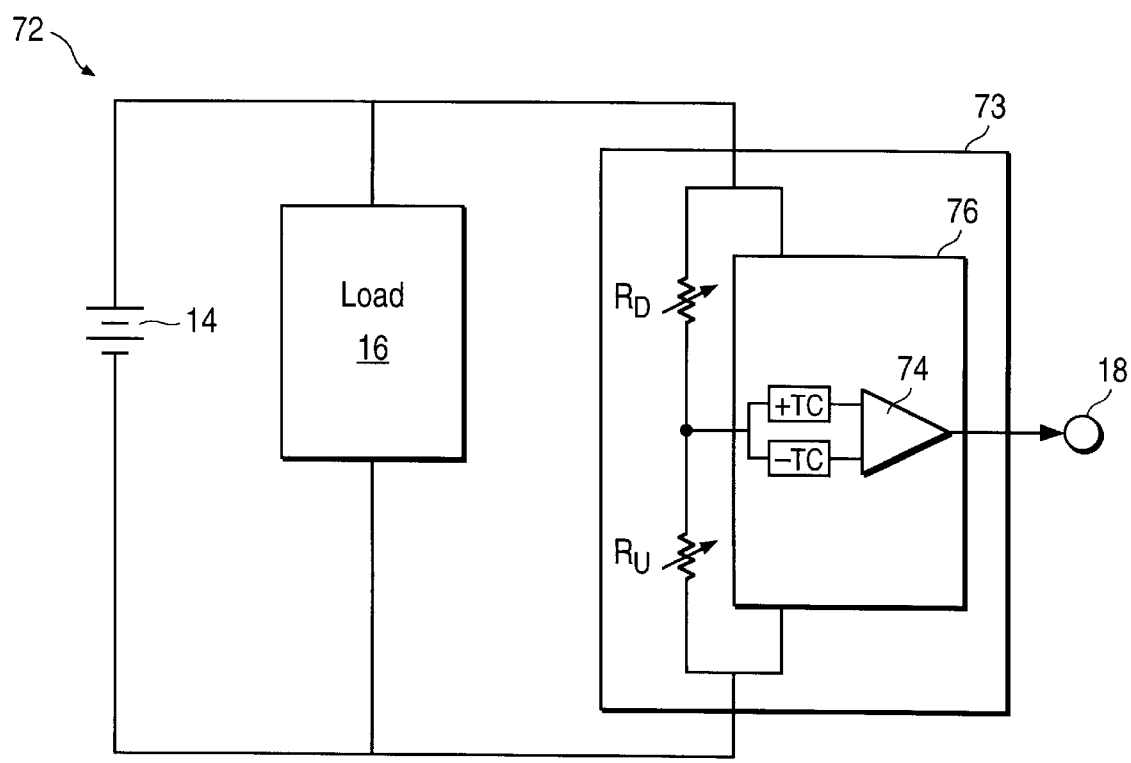
FIG. 9 is a block diagram of a battery operated device incorporating the inventive voltage detector.

FIG. 9 illustrates a battery operated device 72 in accordance with the invention. The battery 14 and primary load 16 are connected as in FIG. 1. The voltage detector 73 is made up of the resistor divider and the voltage reference portion 76 (which also includes comparator 74) generating offsetting positive and negative temperature coefficient signals so that the threshold voltage for detector 73 is constant over a wide range of temperatures. The output of detector 73 is coupled to an LED 18 and/or to a control circuit in load 16.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A battery operated device including a voltage detector comprising:
    a first terminal of a voltage detector connected to a first battery terminal and a second terminal of said voltage detector connected to a second battery terminal;
    a voltage reference source in said voltage detector comprising a first node and a second node, said voltage reference source including one or more components for generating a signal with a negative temperature coefficient applied to said first node and one or more components for generating a signal with a positive temperature coefficient applied to said second node for offsetting said negative temperature coefficient, said voltage reference source further including a comparator,
    said comparator having a third terminal coupled to said first node and a fourth terminal coupled to said second node; and
    a voltage divider network connected between said first terminal and said second terminal for creating a divided battery voltage, a signal corresponding to said divided battery voltage being applied to said one or more components for generating a signal with a negative temperature coefficient and being applied to said one or more components for generating a signal with a positive temperature coefficient, an output of said comparator indicating when said divided battery voltage is below a threshold voltage.

2. The device of claim 1 wherein said output of said comparator is connected to indicate to an operator of said device when said divided battery voltage is below said threshold voltage.

3. The device of claim 1 wherein said one or more components for generating a signal with a positive temperature coefficient comprises a first transistor, and said one or more components for generating a signal with a negative temperature coefficient comprises a second transistor, said first transistor having an emitter which is larger than an emitter of said second transistor to generate different base-to-emitter voltages across said first transistor and said second transistor.

4. The device of claim 3 wherein a first terminal of said first transistor is connected to a voltage divider, said third terminal of said comparator being connected to said voltage divider providing a divided voltage.

5. The device of claim 4 wherein a first terminal of said second transistor is connected to said fourth terminal of said comparator.

6. The device of claim 3 wherein said first transistor and said second transistor are PNP transistors.

7. The device of claim 3 wherein said first transistor and said second transistor are NPN transistors.

8. The device of claim 3 wherein said first transistor and said second transistor are PNP transistors, each having their base and collector connected to ground.

9. The device of claim 3 wherein said first transistor and said second transistor are NPN transistors, each having their base connected to said input terminal of said voltage reference source.

10. The device of claim 1 wherein said voltage reference source comprises an enhancement mode MOS transistor and a depletion mode MOS transistor, a gate of said depletion mode MOS transistor being connected to a gate of said enhancement mode MOS transistor via a resistor.

11. The device of claim 1 wherein said one or more components for generating a signal with a positive temperature coefficient comprises an enhancement mode MOS transistor, and said one or more components for generating a signal with a negative temperature coefficient comprises a depletion mode MOS transistor, a gate of said depletion mode MOS transistor being connected to a gate of said enhancement mode MOS transistor via a resistance.

\* \* \* \* \*